(12) United States Patent
Araki

(10) Patent No.: US 8,237,491 B2
(45) Date of Patent: Aug. 7, 2012

(54) SEMICONDUCTOR DEVICE

(75) Inventor: Norihiko Araki, Shiga (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 244 days.

(21) Appl. No.: 12/318,950

(22) Filed: Jan. 13, 2009

(65) Prior Publication Data

US 2009/0189676 A1 Jul. 30, 2009

(30) Foreign Application Priority Data

Jan. 29, 2008 (JP) ................................ 2008-017325

(51) Int. Cl.
*H03K 17/56* (2006.01)
(52) U.S. Cl. ......... 327/424; 327/534; 327/276; 257/413
(58) Field of Classification Search .................. 257/215, 257/371, 503, 773, 341, 343, 337; 327/424, 327/212, 564–566
See application file for complete search history.

(56) References Cited

U.S. PATENT DOCUMENTS

| | | | | |
|---|---|---|---|---|
| 5,498,897 A | * | 3/1996 | Komatsuzaki et al. | 257/413 |
| 6,331,794 B1 | * | 12/2001 | Blanchard | 327/112 |
| 6,593,792 B2 | * | 7/2003 | Fujii | 327/276 |
| 6,891,739 B2 | * | 5/2005 | Nadd et al. | 363/147 |
| 2008/0174359 A1 | * | 7/2008 | Osada et al. | 327/534 |
| 2008/0252372 A1 | * | 10/2008 | Williams | 330/251 |

FOREIGN PATENT DOCUMENTS

JP 2000-311953 11/2000

* cited by examiner

*Primary Examiner* — Marcos D. Pizarro
*Assistant Examiner* — Suian Tang
(74) *Attorney, Agent, or Firm* — McGinn IP Law Group, PLLC

(57) ABSTRACT

A semiconductor device includes a first conductive type first transistor, a first conductive type second transistor, a first power supply pad arranged between the first transistor and the second transistor and supplying a first potential, a second conductive type third transistor, a second conductive type fourth transistor, a second power supply pad arranged between the third transistor and the fourth transistor and supplying a second potential, a first output pad arranged between the first transistor and the third transistor, and a second output pad arranged between the second transistor and the fourth transistor, in which a direction in which a line connecting the first power supply pad with the second power supply pad extends is perpendicular to a direction in which a line connecting the first output pad with the second output pad extends.

15 Claims, 15 Drawing Sheets

SEMICONDUCTOR DEVICE

BACKGROUND

1. Field of the Invention

The present invention relates to a semiconductor device, and more particularly, to a semiconductor device including an H bridge circuit.

2. Description of Related Art

H bridge circuits formed of power transistors are mainly used for drive control of motors, and in recent years, embedded in semiconductor devices for use.

FIG. 10 shows an H bridge circuit 100 generally having a two-channel structure as a related art. The H bridge circuit 100 includes P type power MOS transistors Qp1, Qp2, Qp3, and Qp4, N type power MOS transistors Qn1, Qn2, Qn3, and Qn4, and loads 131 and 132 such as motors. Each of the P type power MOS transistors Qp1 to Qp4 and each of the N type power MOS transistors Qn1 to Qn4 form a pair, respectively, and each pair is connected in series between VM pads 111 supplying a power supply voltage VM and GND pads 112 supplying a ground voltage GND. The loads 131 and 132 are connected between output pads 113. Each of the transistors Qp1 to Qp4, Qn1 to Qn4 and each of the pads 111, 112, and 113 are electrically connected by aluminum wirings formed in layers. A technique of forming the aluminum wiring layer by two layers for the purpose of reducing a layout area is disclosed in Japanese Unexamined Patent Application Publication No. 2000-311953 (patent document 1).

FIGS. 11 to 13 show examples in which the structure of patent document 1 (one-channel structure) is arranged into the two-channel structure. First, as shown in FIG. 11, a layout of a semiconductor chip 101 includes nine pads including three GND pads 112, two VM pads 111, and four output pads 113, cells 121 forming N type power MOS transistors Qn1, Qn2, Qn3, and Qn4, and cells 122 forming P type power MOS transistors Qp1, Qp2, Qp3, and Qp4. In the drawings, the GND pad 112 is indicated by "G", the VM pad by "V", and the output pad by "O".

In the cells 121 and 122, there are formed source regions 131, drain regions 132, and gate electrodes 133. When a power transistor is formed on the semiconductor substrate in general, a source region, a gate electrode, a drain region, a gate electrode, a source region, . . . are repeatedly arranged in this order. While the source region 131 and the drain region 132 are diffusion layers formed in the semiconductor substrate, the gate electrode 133 is a polysilicon wiring formed on the semiconductor substrate through a gate oxide film or the like (not shown). Note that the gate electrodes 133 are commonly connected and electrically connected to a gate pad or the like (not shown).

The pads 111, 112, and 113 are arranged in a line of G, O, V, O, G, O, V, O, G in this order along with a chip end 29a in a X direction in FIG. 11. Further, the P type power MOS transistors Qp1 to Qp4 and the N type power MOS transistors Qn1 to Qn4 are arranged in a line of Qn1, Qp1, Qp2, Qn2, Qn3, Qp3, Qp4, and Qn4 in this order inside the chip of the pads 111, 112, and 113 in a X direction in FIG. 11.

Next, a wiring structure of the semiconductor chip 101 will be described with reference to FIGS. 12 and 13. FIG. 12 is an upper diagram showing an aluminum wiring layer in a lower layer. Note that the source region 131 and the drain region 132 shown in FIG. 11 are omitted. A source wiring 141 and a drain wiring 142 are formed as aluminum wirings in the upper part of the source region 131 and the drain region 132 with an interlayer insulating film interposed therebetween. Each of the source region 131 and the source wiring 141, and the drain region 132 and the drain wiring 142 is electrically connected by a contact (not shown) penetrating the interlayer insulating film.

FIG. 13 is an upper diagram showing the aluminum wiring layer of the upper layer. As shown in FIG. 13, a source leading-out line 151 electrically connected to the VM pad 111, a source leading-out line 152 electrically connected to the GND pad 112, and a drain leading-out line 153 electrically connected to the output pad 113 are formed in the upper part of the drain wiring 142 and the source wiring 141 that are aluminum wiring layers of the lower layer with the interlayer insulating film interposed therebetween. Each of the source leading-out lines 151 and 152 is connected to the underlying source wiring 141 of FIG. 12 by a contact 154 penetrating the interlayer insulating film. Similarly, the drain leading-out line 153 is electrically connected to the underlying drain wiring 142 of FIG. 12 by a contact 155 penetrating the interlayer insulating film. The source leading-out lines 151, 152 and the drain leading-out line 153 are formed of wiring layers having large width so as to cover substantially half of each cell which is the area where the transistor is formed in order to increase the cross-sectional area of the wiring.

SUMMARY

In recent years, there has been a strong demand for reducing a size of a package of a semiconductor device. To that end, there is a need to reduce the number of pads of the semiconductor chip mounted on the package. As the output pads of the above-described pads are preferentially secured, the number of VM pads and the number of GND pads need to be reduced. In order to achieve this object, one method may be conceived in which the aluminum wiring layer is formed of a three-layer structure. However, this method causes a problem as follows.

Referring to FIGS. 14 and 15, the problem when the aluminum wiring layer is formed of the three-layer structure to reduce the number of GND pads and the number of VM pads will be described. FIGS. 14 and 15 are upper diagrams of the wiring pattern of an intermediate layer and an upper layer, respectively.

A semiconductor chip 201 includes six pads of one VM pad 111, one GND pad 112, and four output pads 113. The cells formed in the semiconductor chip 201 are the same as those of the semiconductor chip 101; and therefore, the description will be omitted. Similarly, the source wiring 141 and the drain wiring 142 that are lower layer aluminum wirings formed in each of the cells are the same as those of the semiconductor chip 101; and therefore, the description will be omitted.

FIG. 14 is an upper diagram showing the aluminum wiring layer of the intermediate layer. Source leading-out lines 251 and 252 and drain leading-out lines 153 are formed on the interlayer insulating film. As the structure of the drain leading-out line 153 is the same as that of the semiconductor chip 101, the description will be omitted. Each of the source leading-out lines 251 and 252 is electrically connected to the underlying source wiring 141 by the contact 154 penetrating the interlayer insulating film. Further, the source leading-out line 252 arranged on the cell forming the N type power MOS transistor Qn4 is formed to have great width so that it may be electrically connected to the GND pad 112 arranged in a chip end 29b side. The reason for forming the GND pad 112 in the chip end 29b side is that the increase of the layout area can be suppressed and the bonding can be easily performed as the GND pad 112 is close to the chip end 29b compared with the case in which the GND pad 112 is arranged in the opposite side of the chip end 29a with respect to the cells.

FIG. 15 is an upper diagram showing the aluminum wiring layer of the upper layer. A GND leading-out line 262 and a VM leading-out line 261 are formed on the interlayer insulating film. The GND leading-out line 262 is connected by contacts 264 penetrating the interlayer insulating film so as to integrate the underlying source leading-out lines 252 (three lines in FIG. 14). The VM leading-out line 261 is connected by contacts 263 penetrating the interlayer insulating film so as to integrate the underlying source leading-out lines 251 (two lines in FIG. 14).

Although the number of pads can be reduced from nine to six in the semiconductor chip 201 compared with the semiconductor chip 101, there is caused a problem as follows. In the semiconductor chip 201, one GND pad 112 is arranged near the outermost source leading-out line 252, and thus, the wiring resistance increases as the source leading-out line 252 is away from the GND pad 112. In other words, the wiring resistance between the N type power MOS transistor Qn1 and the GND pad 112 becomes larger than the wiring resistance of the N type power MOS transistor Qn4 and the GND pad 112. Accordingly, there is caused a difference between the on resistance of the N type power MOS transistor Qn1 and that of the N type power MOS transistor Qn4, and thus, the size A, which is the wiring width in a X direction of the GND leading-out line 262 needs to be increased in consideration of the wiring resistance from the source leading-out line 252 of the N type power MOS transistor Qn1 that is arranged farthermost from the GND pad 112.

Further, current of two channels flows in the VM leading-out line 261. The size B, which is the width in the Y direction of the VM leading-out line 261, needs to be increased in consideration of the allowable current density in order to enhance the resistance against the migration. As such, although the number of pads can be reduced, the layout size increases, which increases the cost for manufacturing the semiconductor chip 201.

As described above, in the layout of the semiconductor chip 201, the layout area increases when the number of pads is reduced by employing the three-wiring structure.

A first exemplary aspect of an embodiment of the present invention is a semiconductor device, including a first conductive type first transistor, a first conductive type second transistor, a first power supply pad arranged between the first transistor and the second transistor and supplying a first potential, a second conductive type third transistor, a second conductive type fourth transistor, a second power supply pad arranged between the third transistor and the fourth transistor and supplying a second potential, a first output pad arranged between the first transistor and the third transistor, and a second output pad arranged between the second transistor and the fourth transistor, in which a direction in which a line connecting the first power supply pad with the second power supply pad extends is perpendicular to a direction in which a line connecting the first output pad with the second output pad extends.

According to the semiconductor device of the present invention, it is possible to reduce the layout area while reducing the number of pads in the chip.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
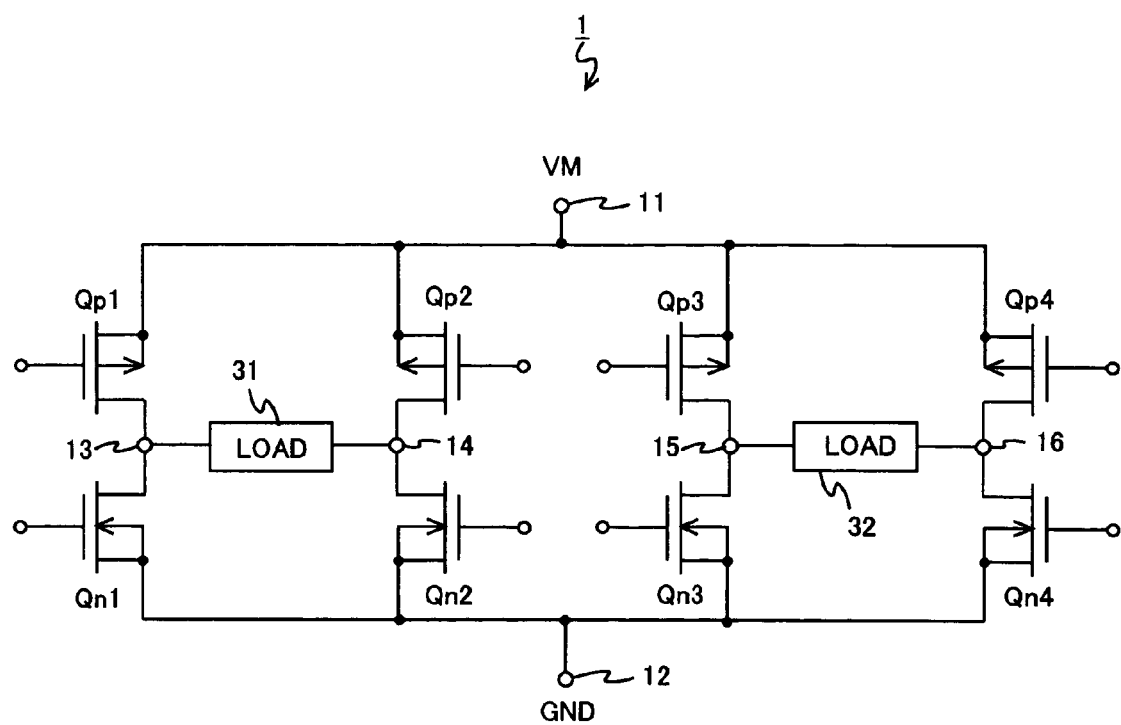
FIG. 1 is a configuration diagram of an H bridge circuit according to an exemplary embodiment.

The components used in [WHAT IS CLAIMED IS] are added with parentheses to the numbers or symbols used in [DETAILED DESCRIPTION OF THE EXEMPLARY EMBODIMENTS] below in order to make clear the correspondence relation between the numbers or symbols used in [DETAILED DESCRIPTION OF THE EXEMPLARY EMBODIMENTS] and the components used in [WHAT IS CLAIMED IS]. However, it is not intended to use the correspondence relation for interpreting the technical scope of the invention described in [WHAT IS CLAIMED IS]. Now, an exemplary embodiment of the present invention will be described with reference to the drawings. FIG. 1 shows an H bridge circuit 1 with a two-channel structure according to the exemplary embodiment of the present invention. The H bridge circuit 1 includes P type power MOS transistors Qp1 (seventh transistor), Qp2 (third transistor), Qp3 (fourth transistor), Qp4 (eighth transistor), N type power MOS transistors Qn1 (fifth transistor), Qn2 (first transistor), Qn3 (second transistor), Qn4 (sixth transistor), and loads 31 and 32 such as motors.

Sources of the P type power MOS transistors Qp1, Qp2, Qp3, and Qp4 are connected to a VM pad 11 (second power supply pad) supplying a power supply voltage VM. Sources of the N type power MOS transistors Qn1, Qn2, Qn3, and Qn4 are connected to a GND pad 12 (first power supply pad) outputting a ground voltage GND. Drains of the P type power MOS transistor Qp1 and the N type power MOS transistor Qn1 are connected to an output pad 13 (third output pad). Drains of the P type power MOS transistor Qp2 and the N type power MOS transistor Qn2 are connected to an output pad 14 (first output pad). Drains of the P type power MOS transistor Qp3 and the N type power MOS transistor Qn3 are connected to an output pad 15 (second output pad). Drains of the P type power MOS transistor Qp4 and the N type power MOS transistor Qn4 are connected to an output pad 16 (fourth output pad). The load 31 is connected between the output pad 13 and the output pad 14. The load 32 is connected between the output pad 15 and the output pad 16. Further, each gate of the transistors Qp1 to Qp4 and Qn1 to Qn4 is connected to a control terminal.

Figure 2:
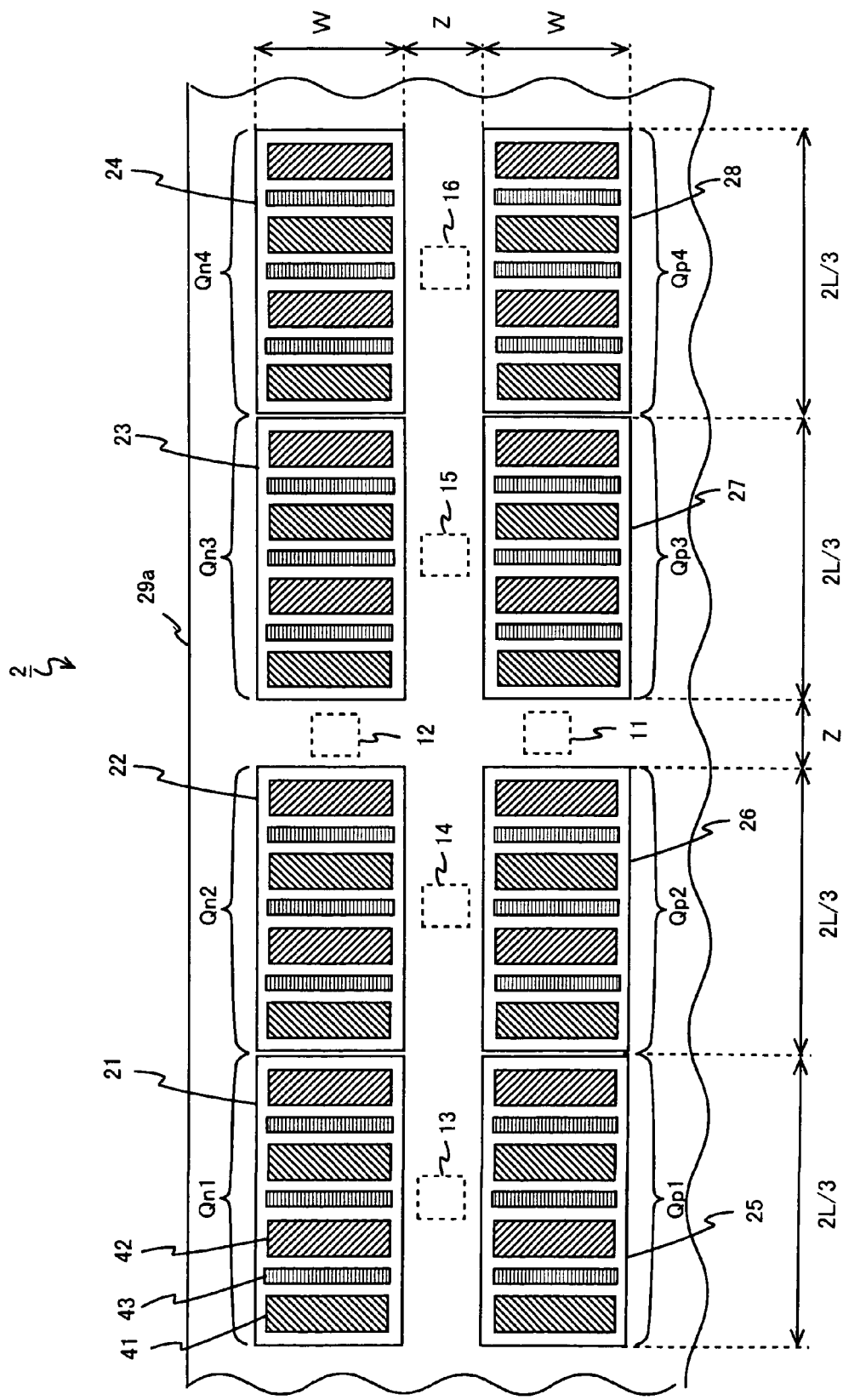
FIG. 2 shows a layout of a chip of a semiconductor device according to the exemplary embodiment.

FIGS. 2 to 5 show layouts of a semiconductor chip 2 in which the H bridge circuit 1 is formed. First, FIG. 2 is a layout diagram of cells 21, 22, 23, and 24 corresponding to the N type power MOS transistors Qn1, Qn2, Qn3, and Qn4 arranged on a semiconductor substrate 3 of the semiconductor chip 2, cells 25, 26, 27, and 28 corresponding to the P type power MOS transistors Qp1, Qp2, Qp3, and Qp4, one VM pad 11, one GND pad 12, and four output pads 13, 14, 15, and 16. Note that the VM pad 11, the GND pad 12, and the output pads 13, 14, 15, and 16 are not formed on the semiconductor substrate 3 but are formed in a wiring layer formed in the upper part of the semiconductor substrate 3 with an interlayer insulating film interposed therebetween. FIG. 2 only shows the place of the arrangement.

Drain regions 41, source regions 42, and gate electrodes 43 are formed in each of the cells 21 to 28. This drain region 41, the gate electrode 43, and the source region 42 form a field effect transistor. The drain region 41 and the source region 42 of the cells 21, 22, 23, and 24 form a first conductive type (hereinafter referred to as N type) impurity diffusion region in a second conductive type (hereinafter referred to as P type) well formed in the semiconductor substrate 3. The drain region 41 and the source region 42 of the cells 25, 26, 27, and 28 form a p type impurity diffusion region in an N type well. The gate electrode 43 is an electrode made of a polysilicon wiring formed on the semiconductor substrate 3 with a gate oxide film (not shown) interposed therebetween.

As shown in FIG. 2, in each cell 21 to 28, the drain region 41, the gate electrode 43, the source region 42, the gate electrode 43, and the drain region 41 . . . are alternately arranged in this order. The gate electrodes 43 are commonly connected in each cell, and are electrically connected to a gate pad or the like (not shown).

Now, a chip end is shown by 29a. The direction in which the drain regions 41, the gate electrodes 43, and the source regions 42 of each cell 21 to 28 are arranged is formed in parallel with the chip end 29a (X direction). The cells 21, 22, 23, and 24 are arranged in the chip end 29a side to be parallel with the chip end 29a. The cell 25 is arranged on the opposite side of the chip end 29a with respect to the cell 21 so that the output pad 13 is interposed between the cell 25 and the cell 21. The cell 26 is arranged on the opposite side of the chip end 29a with respect to the cell 22 so that the output pad 14 is interposed between the cell 26 and the cell 22. The cell 27 is arranged on the opposite side of the chip end 29a with respect to the cell 23 so that the output pad 15 is interposed between the cell 27 and the cell 23. The cell 28 is arranged on the opposite side of the chip end 29a with respect to the cell 24 so that the output pad 16 is interposed between the cell 28 and the cell 24. The GND pad 12 is arranged between the cell 22 and the cell 23. The VM pad 11 is arranged between the cell 26 and the cell 27. As shown in FIG. 2, the positional relation of each pad is such that the direction in which the line connecting the VM pad 11 and the GND pad 12 extends is substantially orthogonal to the direction in which the line connecting the output pads 13 to 16 extends.

Figure 3:
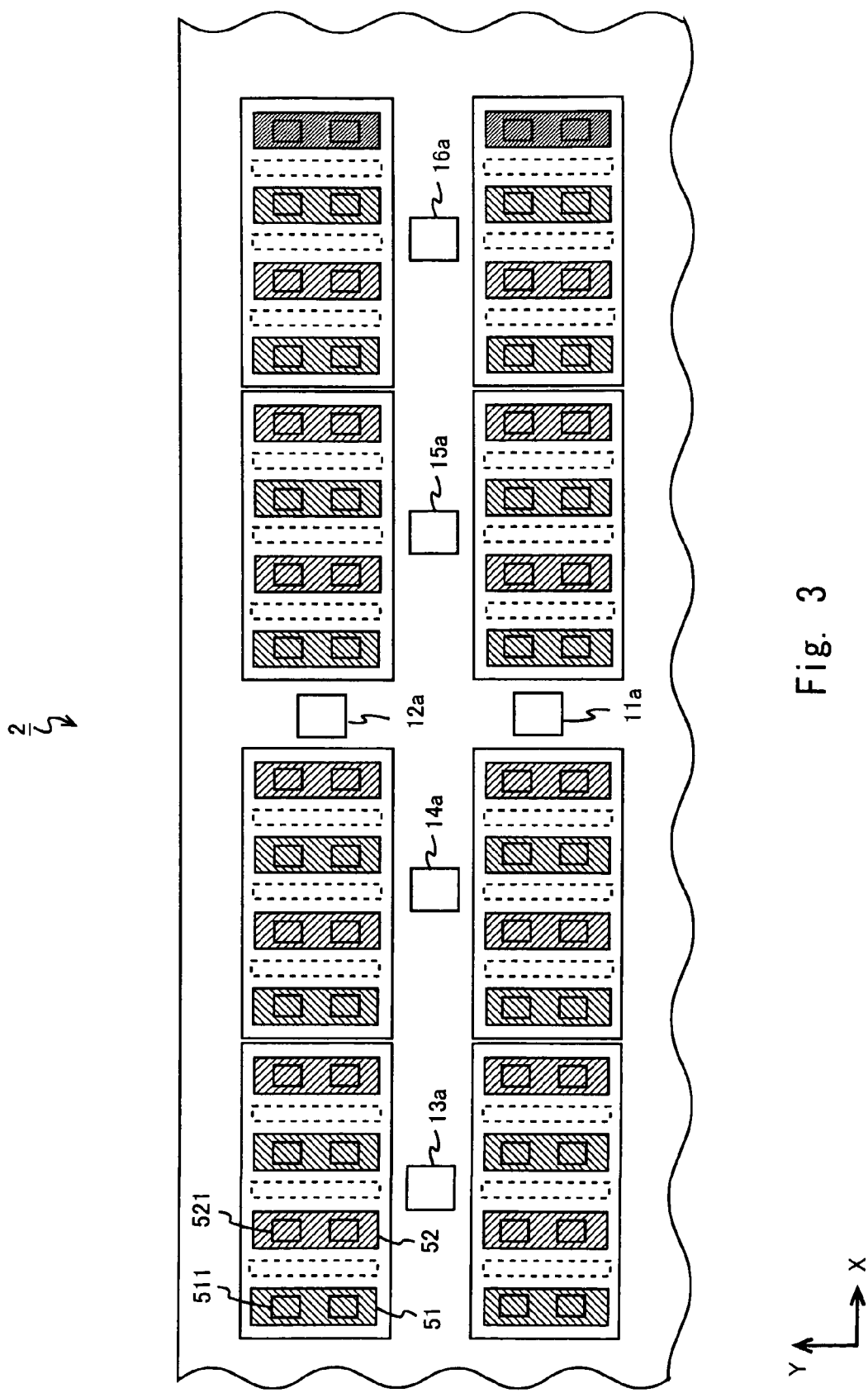
FIG. 3 shows a layout of an aluminum wiring in a lower layer of the chip of the semiconductor device according to the exemplary embodiment.
Figure 4:
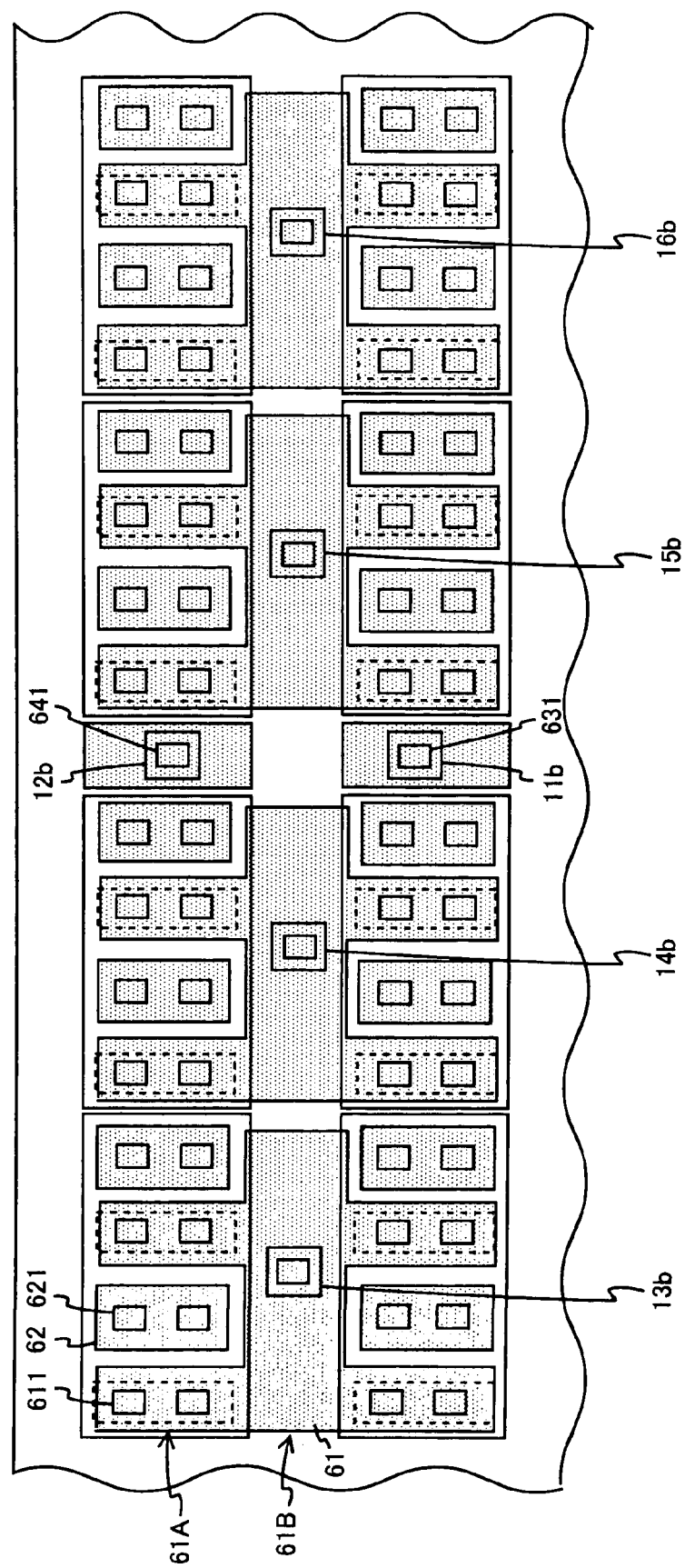
FIG. 4 shows a layout of an aluminum wiring in an intermediate layer of the chip of the semiconductor device according to the exemplary embodiment.
Figure 5:
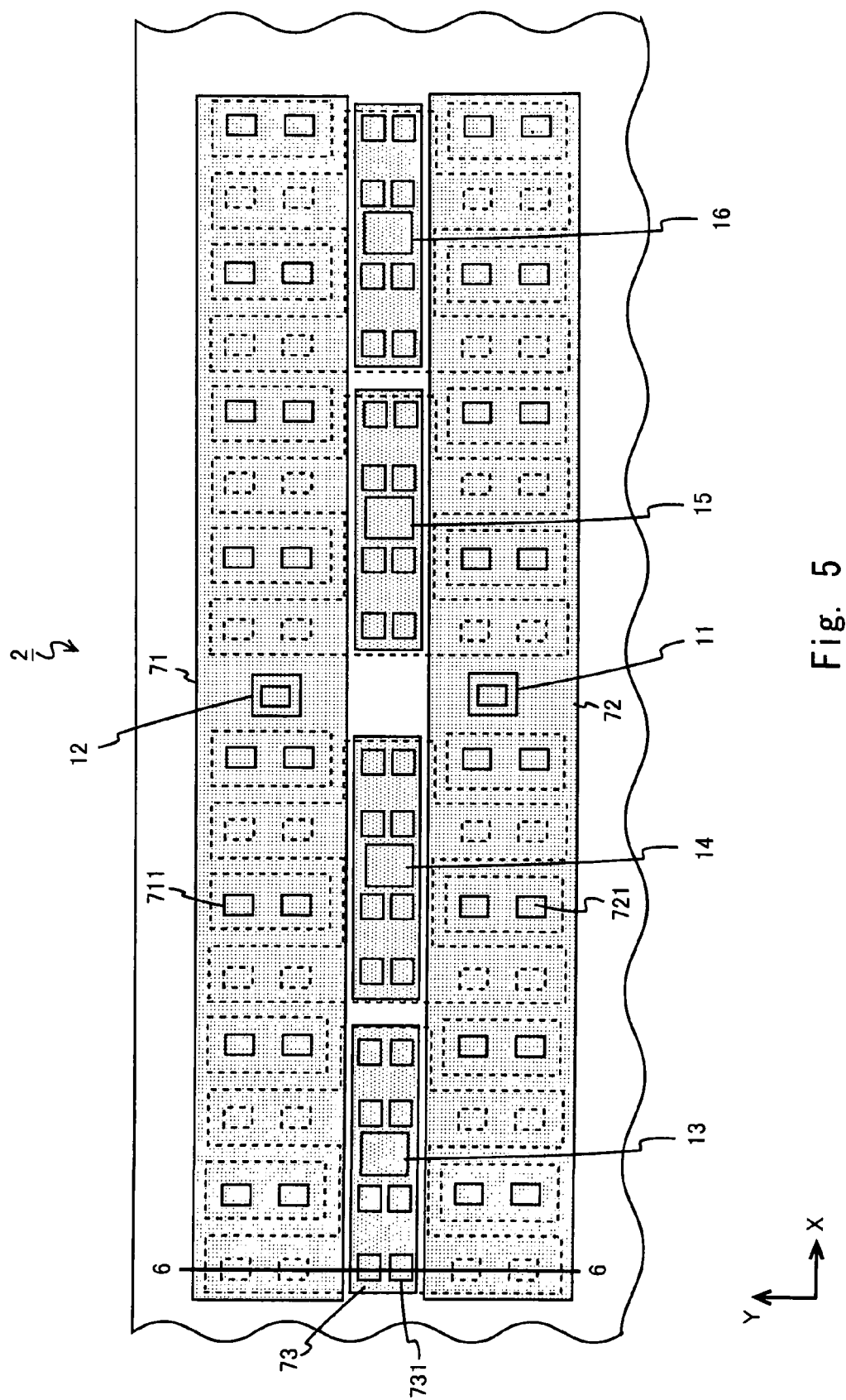
FIG. 5 shows a layout of an aluminum wiring in an upper layer of the chip of the semiconductor device according to the exemplary embodiment.
Figure 6:
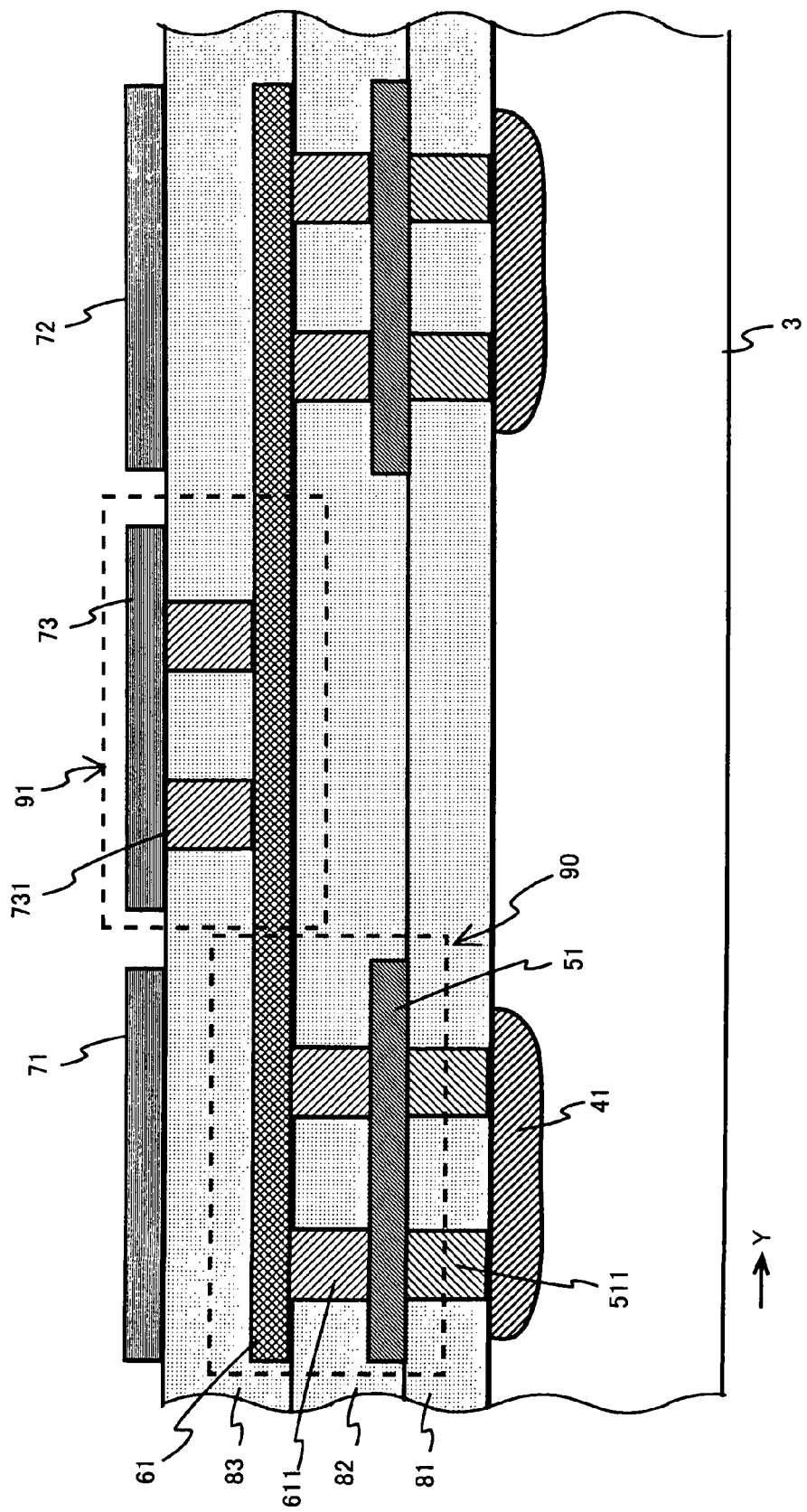
FIG. 6 is a cross sectional diagram of the chip of the semiconductor device according to the exemplary embodiment.

Next, the structure of the wiring of the semiconductor chip 2 according to the exemplary embodiment will be described with reference to FIGS. 3 to 6. The wiring of the semiconductor chip 2 has a three-layer structure of a lower layer, an intermediate layer, and an upper layer. FIG. 3 shows the lower layer, FIG. 4 shows the intermediate layer, and FIG. 5 shows the upper layer. In each drawing, the wiring which is one layer below is shown by dotted lines, and the wiring which is further below is omitted for the sake of simplicity. Further, FIG. 6 is a cross sectional diagram of the line 6-6 of FIG. 5 when seen from the X direction. In the following description, the aluminum wiring is taken by way of an example; however, the wiring material may be other conductive materials.

FIG. 3 is a layout of the aluminum wiring in the lower layer of the first layer. As shown in FIG. 3, a drain wiring 51 having substantially the same shape as the drain region 41 is formed in the upper part of each drain region 41 of FIG. 2 with an interlayer insulating film 81 interposed therebetween (see FIG. 6). The drain region 41 and the drain wiring 51 are electrically connected by a contact 511 penetrating the interlayer insulating film 81. Further, a source wiring 52 having substantially the same shape as the source region 42 is formed on each source region 42 with the interlayer insulating film 81 interposed therebetween. The source region 42 and the source wiring 52 are electrically connected by a contact 521 penetrating the interlayer insulating film 81. Further, one lower layer VM pad 11a, one lower layer GND pad 12a, and four lower layer output pads 13a to 16a are formed in a predetermined position that will be described below.

FIG. 4 is a layout of a second layer (intermediate layer) aluminum wiring. As shown in FIG. 4, an intermediate output leading-out line 61, an intermediate source wiring 62, an intermediate layer VM pad 11b, an intermediate layer GND pad 12b, and intermediate layer output pads 13b to 16b are arranged on the interlayer insulating film 82 (see FIG. 6).

As shown in FIG. 4, the intermediate output leading-out line 61 includes a portion (region 61A in FIG. 4) extending along with the Y direction and formed so as to cover almost the whole part of the drain wiring 51 of each cell in FIG. 3, and a portion (region 61B in FIG. 4) formed so as to cover almost the whole region including each of the intermediate layer output pads 13b to 16b between cells of the N type power MOS transistors and the P type power MOS transistors. Further, a portion (region 61B in FIG. 4) formed so as to cover almost the whole region between the cells of the N type power MOS transistors and the P type power MOS transistors and each of the intermediate layer output pads 13b to 16b are electrically connected. The intermediate source wiring 62 is formed to have substantially the same shape as the source wiring 52 of each cell in FIG. 3.

The intermediate output leading-out line 61 and the drain wiring 51 of the lower layer, and each of the intermediate layer output pads 13b to 16b and the lower layer output pads 13a to 16a are electrically connected by a contact 611 penetrating the interlayer insulating film 82. The intermediate source wiring 62 and the source wiring 52 of the lower layer are electrically connected by a contact 621 penetrating the interlayer insulating film 82. The intermediate layer VM pad

11b and the lower layer VM pad 11a, and the intermediate layer GND pad 12b and the lower layer GND pad 12a are electrically connected by contacts 631 and 641 penetrating the interlayer insulating film 82, respectively.

FIG. 5 is a layout of the aluminum wiring of the upper layer of the third layer. As shown in FIG. 5, a GND leading-out line 71, a VM leading-out line 72, and an output leading-out line 73 are arranged on the interlayer insulating film 83 (see FIG. 6). As shown in FIG. 5, the GND leading-out line 71 is formed so as to cover substantially the whole part of the cells 21 to 24. Further, a GND pad 12 that is exposed by forming an opening in a passivation film is formed in a part of the GND leading-out line 71. Further, the GND leading-out line 71, and the underlying intermediate source wiring 62, and the intermediate layer GND pad 12b are electrically connected by a contact 711 penetrating the interlayer insulating film 83. As a result, the source regions 42 of the cells 21 to 24 and the GND pad 12 are electrically connected.

Similarly, the VM leading-out line 72 is formed so as to cover substantially the whole part of the cells 25 to 28. Further, a VM pad 11 that is exposed by forming an opening in a passivation film is formed in a part of the VM leading-out line 72. Further, the VM leading-out line 72, and the underlying intermediate source wiring 62 and the intermediate layer VM pad 11b are electrically connected by a contact 721 penetrating the interlayer insulating film 83. As a result, the source regions 42 of the cells 25 to 28 and the VM pad 11 are electrically connected.

Each output leading-out line 73 is formed so as to cover substantially the whole portion (region 61B in FIG. 4) formed to cover substantially the whole region between the cells of the P type power MOS transistors and the N type power MOS transistors of each intermediate output leading-out line 61. In a part of each output leading-out line 73, each of the output pads 13 to 16 that is exposed by forming an opening in a passivation film is formed. Further, each output leading-out line 73 and the underlying intermediate output leading-out line 61 are electrically connected by a contact 731 penetrating the interlayer insulating film 83. As a result, the output pad 13 and the drain regions 41 of the cells 21 and 25, the output pad 14 and the drain regions 41 of the cells 22 and 26, the output pad 15 and the drain regions 41 of the cells 23 and 27, and the output pad 16 and the drain regions 41 of the cells 24 and 28 are electrically connected, respectively.

FIG. 6 is a cross sectional view taken along the line 6-6 of FIG. 5 as viewed from the X direction. FIG. 6 shows all the cross sectional parts of the substrate, the lower layer, the intermediate layer, and the upper layer of the semiconductor chip 2. As shown in FIG. 6, the interlayer insulating films 81, 82, and 83 are successively formed on the substrate 3. The drain wiring 51 is formed on the interlayer insulating film 81, the intermediate output leading-out line 61 is formed on the interlayer insulating film 82, and the output leading-out line 73, the GND leading-out line 71, and the VM leading-out line 72 are formed on the interlayer insulating film 83.

As shown in the upper views of FIGS. 3 and 4, the drain wiring 51 and the region 61A of the intermediate output leading-out line 61 have the same shape and overlap with each other in substantially the whole surface. This is shown by an area 90 in the cross sectional diagram of FIG. 6. Further, as shown by the upper views of FIGS. 4 and 5, the region 61B of the intermediate output leading-out line 61 and the output leading-out line 73 have the same shape and overlap with each other in substantially the whole surface. This is shown by an area 91 in the cross sectional diagram of FIG. 6. This brings the same effect as a case in which the aluminum wiring layer which is the current pathway from the drain wiring 51 to the output leading-out line 73 electrically connected are formed substantially in double layers, which means the resistance value of the aluminum wiring layer is made substantially half.

Similarly, as shown in the upper views of FIGS. 4 and 5, the GND leading-out line 71 covers substantially the whole part of the intermediate source wirings 62 electrically connected to the source wirings 52. Further, as shown in the upper views of FIGS. 4 and 5, the VM leading-out line 72 covers substantially the whole part of the intermediate source wirings 62 electrically connected to the source wirings 52. Accordingly, the intermediate source wiring 62 and the GND leading-out line 71, or the intermediate source wiring 62 and the VM leading-out line 72 form the aluminum wiring layer, which is the current pathway, in substantially the double layers. Also in this case, the resistance value of the aluminum wiring layer is made substantially half.

Figure 14:
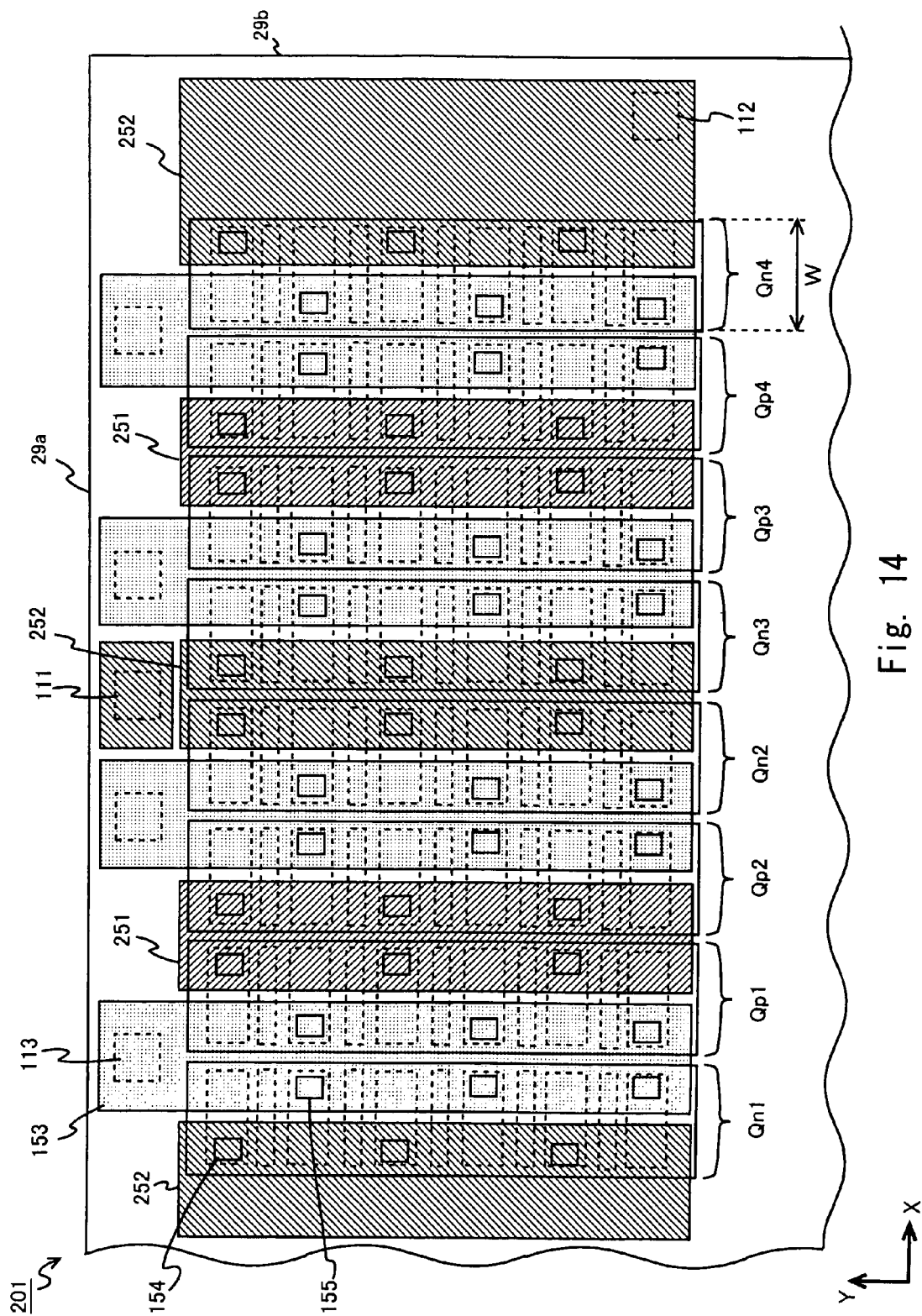
FIG. 14 shows a layout of the aluminum wiring in an intermediate layer of the chip of the semiconductor device in which a number of pads of the chip of the semiconductor device of FIG. 11 is changed.
Figure 15:
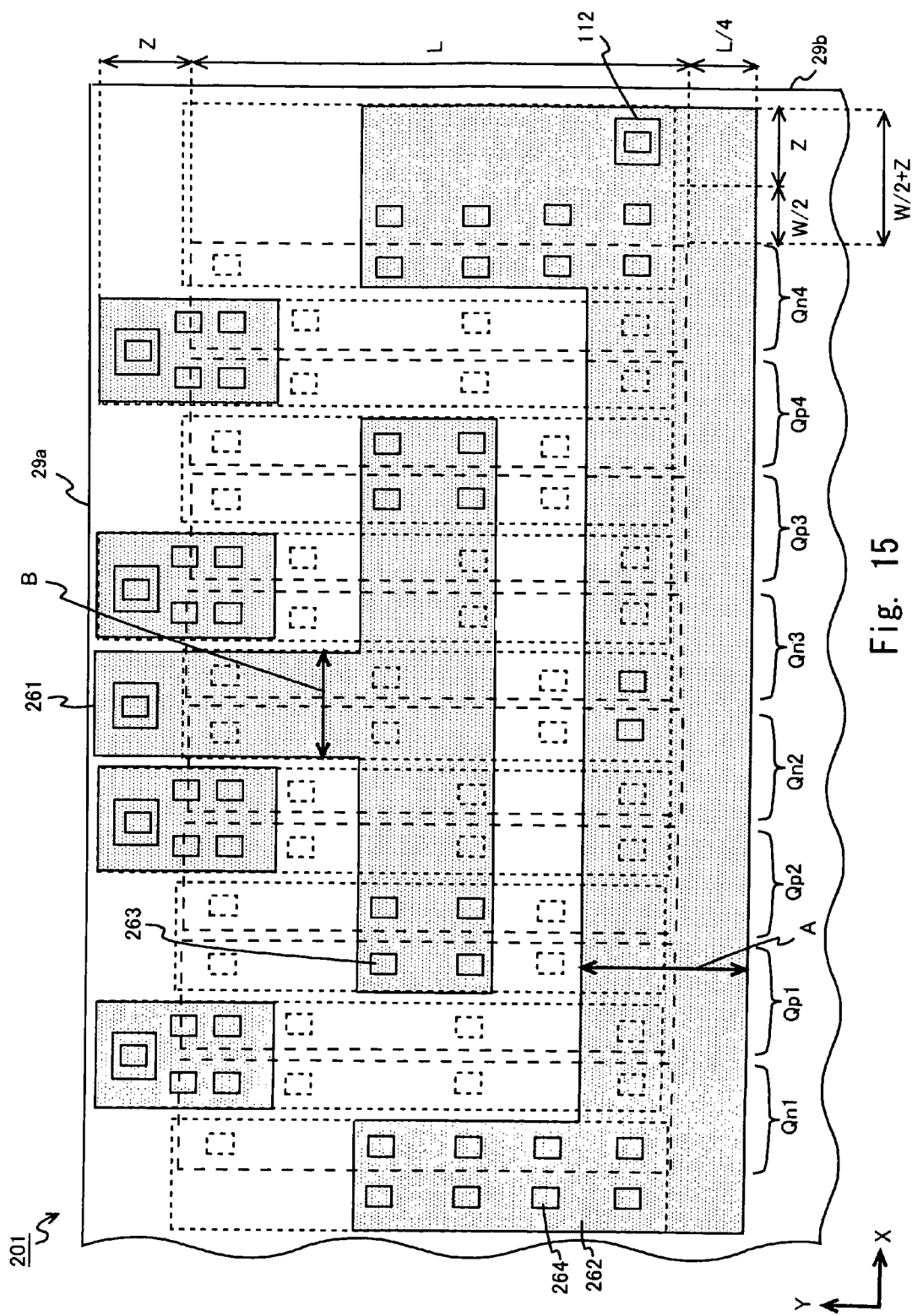
FIG. 15 shows a layout of the aluminum wiring in an upper layer of the chip of the semiconductor device in which the number of pads of the chip of the semiconductor device of FIG. 11 is changed.

As shown in FIGS. 14 and 15, the semiconductor chip 201 has a wiring structure in which only a small part of the VM leading-out line 261 and the GND leading-out line 262 in the third layer overlap with the source leading-out line 251 and the source leading-out line 252 in the second layer. As such, although the semiconductor chip 201 has a three-layer structure, the current supplied to the power MOS transistor needs to be supplied in the aluminum wiring in the third layer, which increases the wiring resistance. Thus, even though the size A and the size B need to be increased in FIG. 15 in consideration of the migration resistance of the wiring, there is a limit in terms of wiring layout. However, according to the exemplary embodiment of this invention, as described above, two aluminum wiring layers overlap in substantially the whole current pathway from the drain region and the source region of the power MOS transistor to each pad, which makes it possible to increase the allowable current amount of the current supplied to the power MOS transistor. This means that the migration resistance of the wiring between the drain regions 41 and the output pads 13 to 16, and that between the source region 42 and the GND pad 12 or the VM pad 11 have increased.

Figure 11:
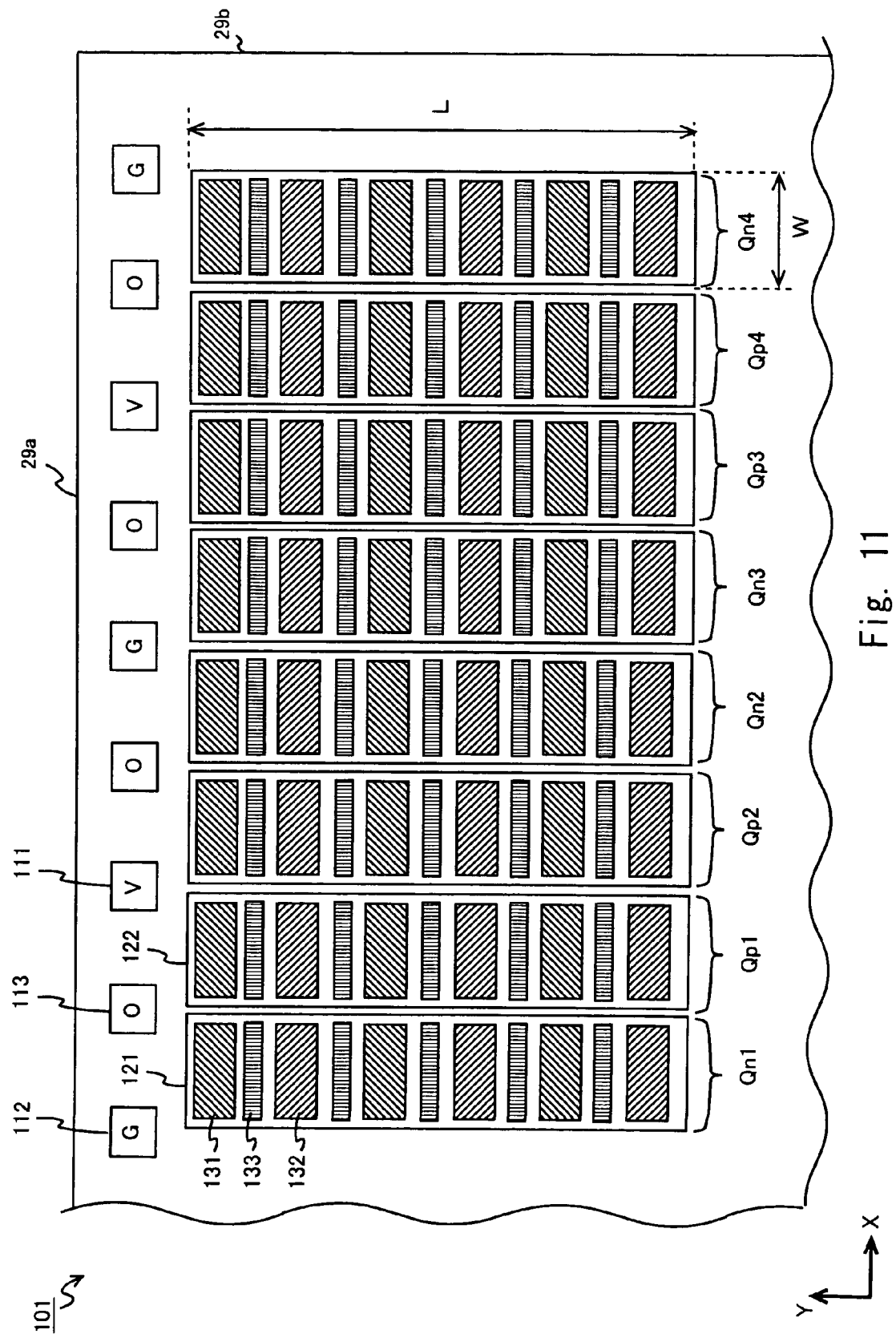
FIG. 11 shows a layout of the chip of the semiconductor device in the chip of the semiconductor device in which the technique of patent document 1 (one-channel structure) is arranged into the two-channel structure.
Figure 12:
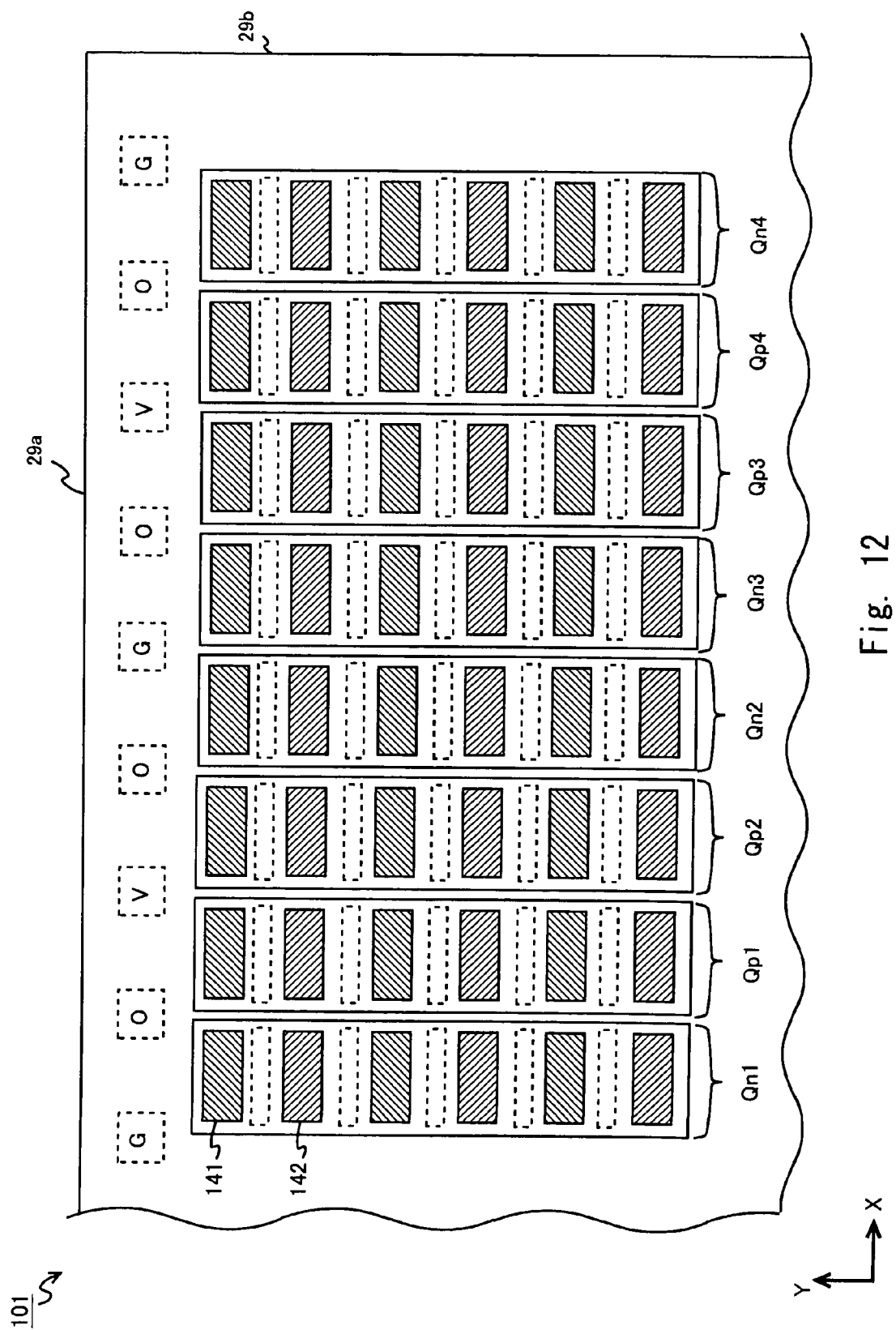
FIG. 12 shows a layout of an aluminum wiring in a lower layer of the chip of the semiconductor device of FIG. 11.

Accordingly, the current amount flowing in each of the source region 42 and the drain region 41 in each of the cells 21 to 28 can be increased. Thus, it is possible to flow a predetermined current amount in less number of source regions 42 and drain regions 41, which makes it possible to reduce the number of source regions 42 and the drain regions 41 of each of the cells 21 to 28. More specifically, while three source-drain regions are required in each cell, for example, in the semiconductor chip 101 shown in FIG. 11, only about two source-drain regions are required in the semiconductor chip 2 according to the exemplary embodiment. As such, when the length of the cells of the semiconductor chip 101 in FIG. 11 is shown by L, the length of the cell in the semiconductor chip 2 can be reduced to L/2 to 2L/3 (shown as 2L/3 in FIG. 2).

Further, as shown in FIG. 5, as the GND pad 12 is arranged between the cells 21 and 24 and the cells 22 and 23, there is no difference in distance from the GND leading-out line 71 to the cell 21 and that from the GND leading-out line 71 to the cell 24, which does not cause the difference in the wiring resistance. Thus, according to the semiconductor chip 2, the difference of the on resistance is less than the semiconductor chip 201.

Now, the layout area of the semiconductor chip 101 and that of the semiconductor chip 201 described in the background art, and the layout area of the semiconductor chip 2 of the exemplary embodiment which makes it possible to reduce the length of the cells as above will be compared. In this comparison example, the length of the cells of the semiconductor chip 2 in the exemplary embodiment is set to 2L/3.

Figure 13:
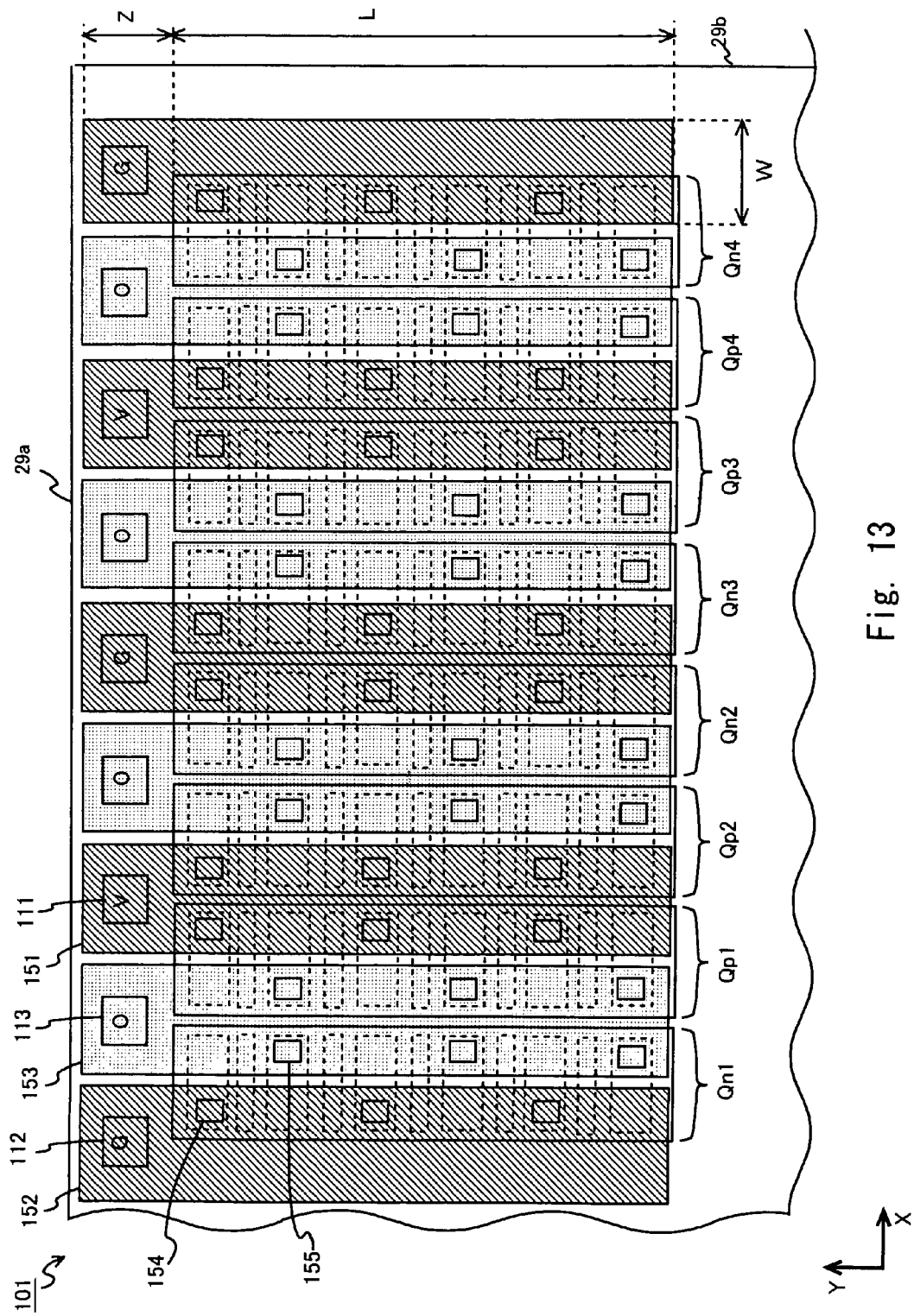
FIG. 13 shows a layout of the aluminum wiring in an upper layer of the chip of the semiconductor device of FIG. 11.

For the rough calculation of the layout area, as shown in FIGS. 13 and 14, the length of the cells of the semiconductor chip 101 and the semiconductor chip 201 is shown by L (hereinafter referred to as size L), and the width by W (hereinafter referred to as size W). Further, the length in which each pad is extended from the cells is shown by Z (hereinafter referred to as size Z). However, as shown in FIG. 13, the width of each leading-out line of the semiconductor chip 101 and the semiconductor chip 201 is also shown by size W. The ratio of the sizes L, W, and Z is set to L:W:Z=4:2:1 for the calculation.

First, a layout area 101A of the semiconductor chip 101 is as follows.

layout area 101A≈(L+Z)×9W=(4+1)×9×2=90

Next, a layout area 201A of the semiconductor chip 201 is as follows. However, as stated above, the GND leading-out line 262 has a large size A in consideration of the decrease of the wiring resistance or the migration resistance. As such, as shown in FIG. 15, the size A of the GND leading-out line 262 is increased by the distance (L/4) from the end of the cell with respect to the Y direction. Further, the distance is shown by (W/2+Z), which is obtained by increasing the width by the amount of extension (Z) of the GND pad 112 from the end of the cell with respect to the X direction.

layout area 201A≈(L+Z+L/4)×(9W+Z)=(4+1+1)×(9×2+1)=114

At last, a layout area 2A of the semiconductor chip 2 is shown below. However, as stated above, in the semiconductor chip 2, the length of the cell can be reduced to about 2L/3, which is used as the length of the cell.

layout area 2A≈(4×2L/3+Z)×(2W+Z)=(4×(8/3)+1)×(4+1)=58

Accordingly, the ratio of the layout area of the semiconductor chip 101, the semiconductor chip 201, and the semiconductor chip 2 is as follows.

layout area 101A: layout area 201A: layout area 2A=1:1.26:0.64

From the above description, it is understood that the semiconductor chip 2 of the present embodiment can reduce the layout area the most. Further, the number of pads may be limited to six, which is the same as the semiconductor chip 201. Accordingly, in the semiconductor chip 2 of the exemplary embodiment, it is possible to reduce the layout area while minimizing the number of pads.

Figure 7:
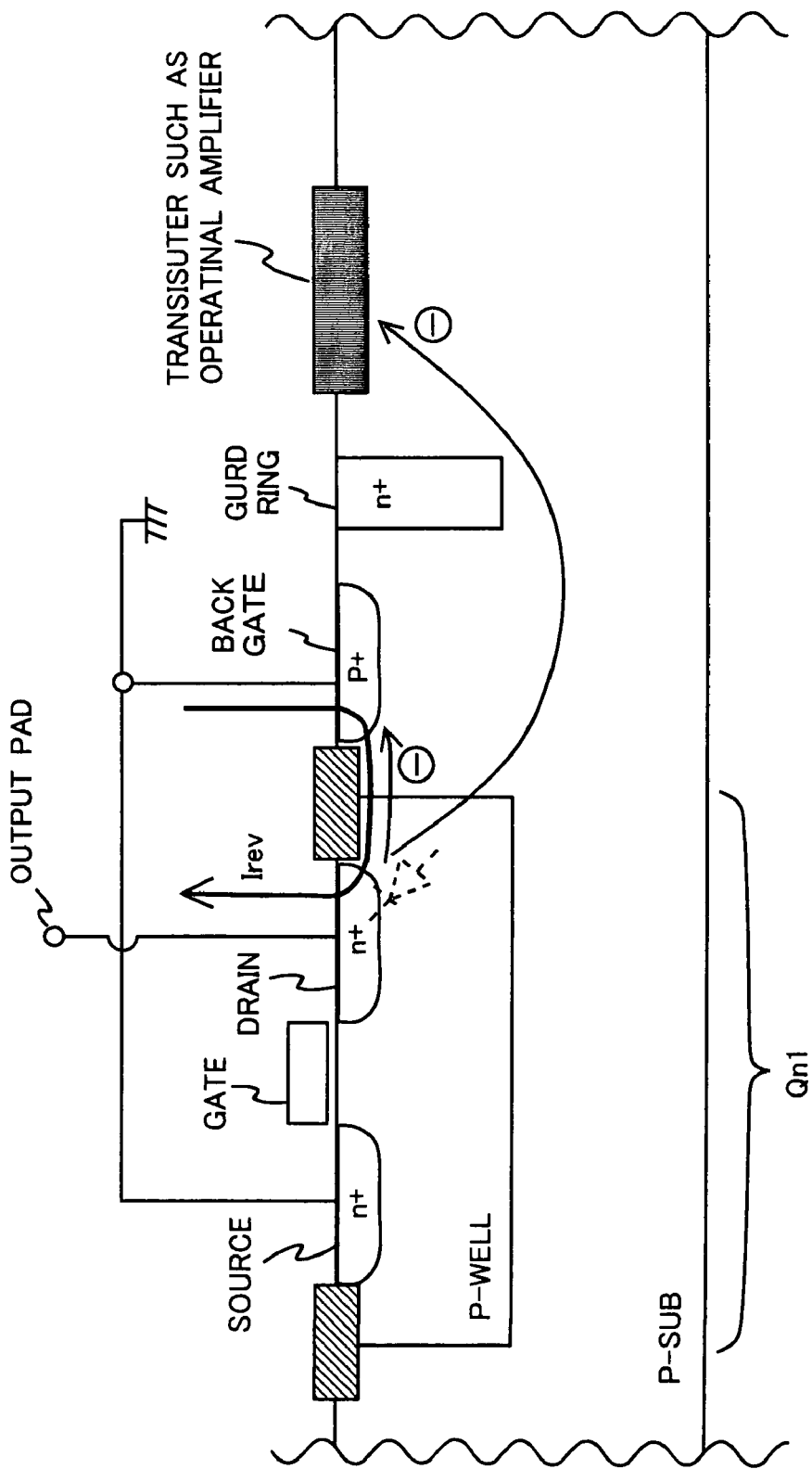
FIG. 7 is a schematic diagram for describing a problem in the chip of the semiconductor device in which a technique of patent document 1 (one-channel structure) is arranged into a two-channel structure.

Further, as shown in FIG. 7, when a counter electromotive current Irev is generated from the motor which is the load, floating electron may be generated by a current flowing in a parasitic diode included in the N type power MOS transistor Qn1 formed on the P-type substrate. Then, the floating electron exceeds the guard ring to reach the internal circuit such as an operational amplifier, a comparator, or the like, which has a bad influence on the performance of the internal circuit such as the increase of the input offset.

However, in the semiconductor chip 2 of the exemplary embodiment, the cells 21 to 24, which are N type power MOS transistors, are arranged near the chip end 29a. Accordingly, when the internal circuit such as operational amplifier is arranged in the cells 25 to 28 side, which are the P type power MOS transistors, the above-described floating electron is absorbed in the well potential side of the P type power MOS transistor, a guard ring or the like, and does not reach the internal circuit.

As such, it is possible to reduce the problem of degrading of performance, such as increase of the input offset of the comparator or the operational amplifier. Further, this effect can be obtained not only by arranging the cells 21 to 24 which are the N type power MOS transistors near the chip end 29a, but also by arranging the internal circuit in the cells 25 to 28 side which are the P type power MOS transistors. This is because the well of the P type power MOS transistor brings the same effect as the guard ring, and the floating electron is absorbed in the well potential side of the P type power MOS transistor. Accordingly, the internal circuit such as amplifier needs not be arranged apart from the H bridge circuit 1 formed of the cells 21 to 28, which increases the freedom of the layout of the internal circuit.

In the exemplary embodiment, the pads 11 to 16 are arranged in the inner side of the chip than the chip end 29a. As the distance between the chip end 29a and the pads 11 to 16 is about 500 μm at maximum, there is no technical difficulty regarding the wire bonding or the like, and therefore, there is caused no problem in the exemplary embodiment.

Figure 8:
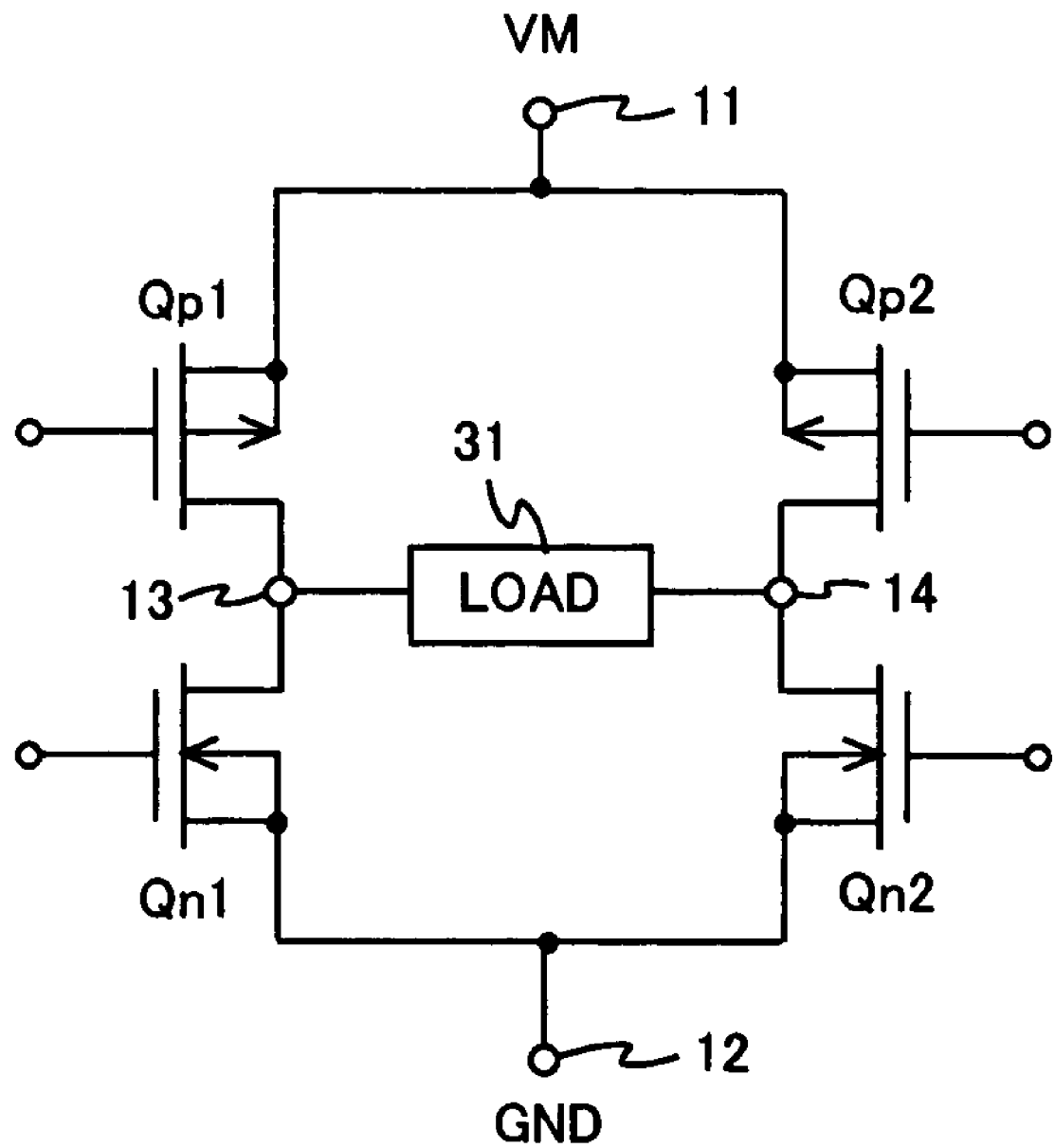
FIG. 8 is a configuration diagram of an H bridge circuit according to another exemplary embodiment.

Note that the present invention is not limited to the above exemplary embodiment, but may be changed as appropriate without departing from the scope of the present invention. For example, although the H bridge circuit of the two-channel structure is employed in the above exemplary embodiment, one-channel H bridge circuit formed of the N type power MOS transistors Qn1, Qn2, the P type power MOS transistors Qp1, Qp2, and the load 31 may be used as shown in FIG. 8.

Figure 9:
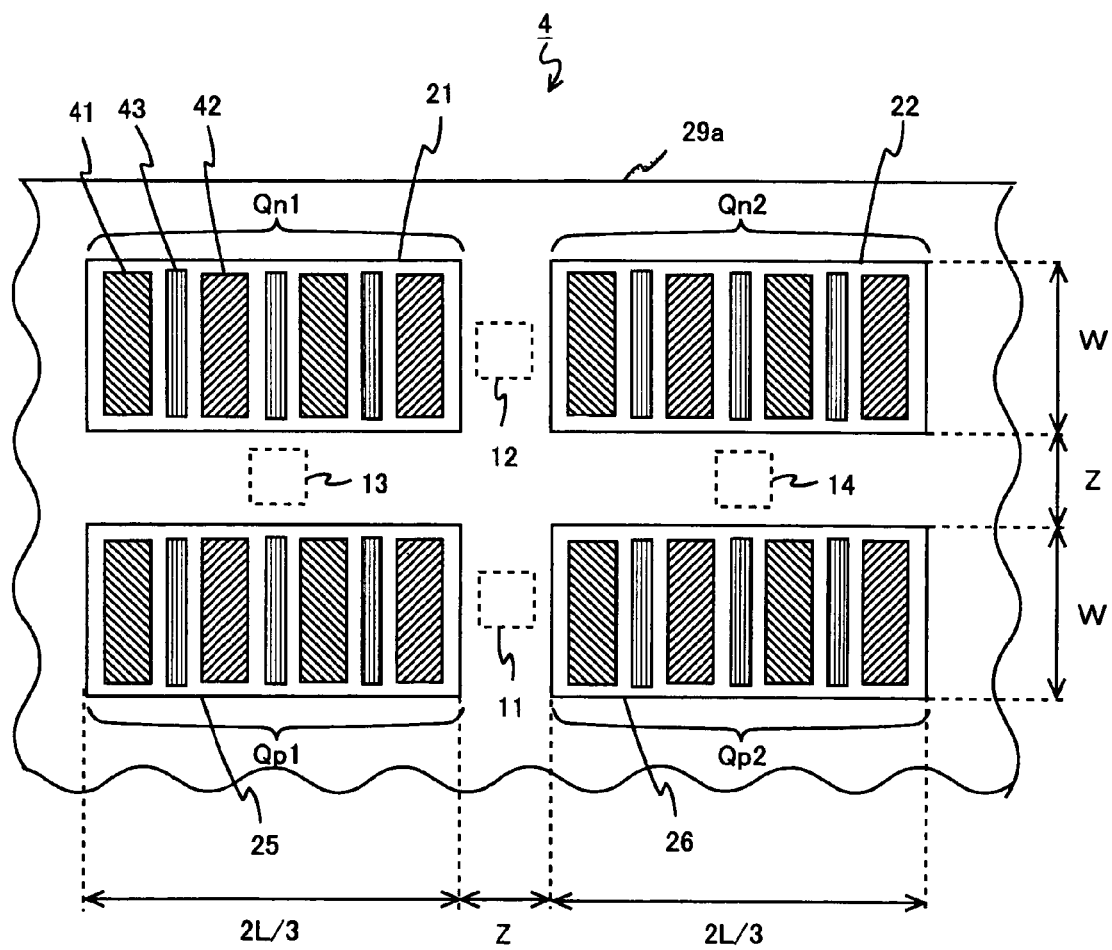
FIG. 9 shows a layout of a chip of a semiconductor device according to another exemplary embodiment.

FIG. 9 shows a layout of a semiconductor chip 4 in which the one-channel H bridge circuit is formed. FIG. 9 is a layout diagram showing the cells 21 and 22 corresponding to the N type power MOS transistors Qn1, Qn2, the cells 25 and 26 corresponding to the P type power MOS transistors Qp1, Qp2, one VM pad 11, one GND pad 12, and two output pads 13, 14. However, as is the same as the above description, the VM pad 11, the GND pad 12, and the output pads 13, 14 are not formed on the substrate 3 but formed in the wiring layer formed in the upper layer of the substrate. In FIG. 9, only the place of the arrangement is shown.

Figure 10:
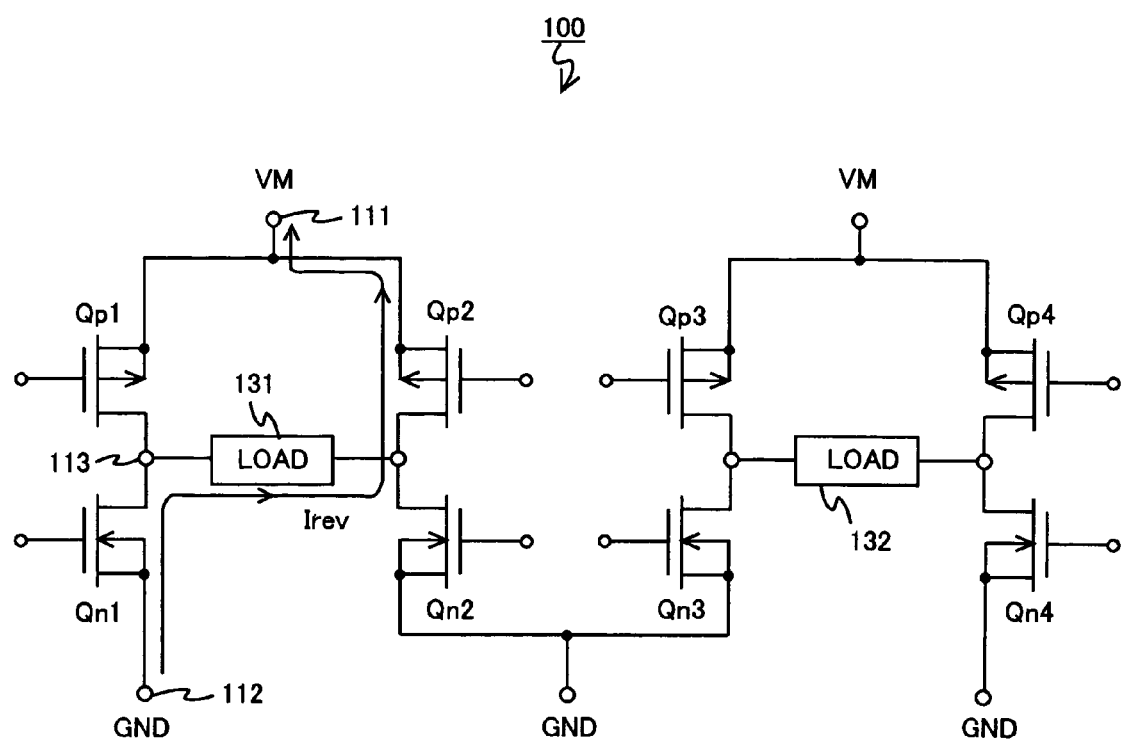
FIG. 10 is a configuration diagram of an H bridge circuit in a chip of a semiconductor device in which a technique of patent document 1 (one-channel structure) is arranged into a two-channel structure.

Note that, in the one-channel H bridge circuit of the configuration of FIG. 10, five pads are arranged: two GND pads, two output pads, and one VM pad. Accordingly, the number of pads can be reduced by one in the one-channel H bridge circuit of the exemplary embodiment. Even when the one-channel H bridge circuit is employed, it is possible to reduce the number of pads and the layout area, though not to the extent of the two-channel H bridge circuit.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device, comprising:
   a first conductive type first transistor;
   a first conductive type second transistor;
   a first power supply pad arranged between the first transistor and the second transistor and supplying a first potential;
   a second conductive type third transistor;
   a second conductive type fourth transistor;
   a second power supply pad arranged between the third transistor and the fourth transistor and supplying a second potential;

a first output pad arranged between the first transistor and the third transistor; and a second output pad arranged between the second transistor and the fourth transistor, wherein a direction in which an axis connecting the first power supply pad with the second power supply pad extends is substantially perpendicular to a direction in which an axis connecting the first output pad with the second, output pad extends, wherein drain regions of the first and third transistors are electrically connected to the first output pad by a first wiring, wherein drain regions of the second and fourth transistors are electrically connected to the second output pad by a second wiring, wherein source regions of the first and second transistors are electrically connected to the first power supply pad by a third wiring, wherein source regions of the third and fourth transistors are electrically connected to the second power supply pad by a fourth wiring, wherein each of the first to fourth wirings includes three conductive layers, such that the layers are layered in a direction perpendicular to both the direction in which the axis connecting the first power supply pad with the second power supply pad extends and direction in which the axis connecting the first output pad with the second output pad extends, and wherein the third wiring includes a lower conductive layer comprising substantially a same shave as a shape of the source regions of the first and second transistors.

2. The semiconductor device according to claim 1, wherein each of the first to fourth transistors comprises drain regions and source regions that are alternately formed in a direction in which the axis connecting the first output pad and the second output pad extends.

3. The semiconductor device according to claim 2, wherein the axis connecting the first output pad and the second output pad extends in a direction parallel with a chip end.

4. The semiconductor device according to claim 1, wherein:
the first wiring overlaps at least in a region in which the drain regions of the first and third transistors and the first output pad are formed in a plan view;
the second wiring overlaps at least in a region in which the drain regions of the second and fourth transistors and the second output pad are formed in a plan view;
the third wiring overlaps at least in a region in which the first and second transistors and the first power supply pad are formed in a plan view; and
the fourth wiring overlaps at least in a region in which the third and fourth transistors and the second power supply pad are formed in a plan view.

5. A semiconductor device, comprising:
a first conductive type first transistor;
a first conductive type second transistor;
a first power supply pad arranged between the first transistor and the second transistor and supplying a first potential;
a second conductive type third transistor;
a second conductive type fourth transistor;
a second power supply pad arranged between the third transistor and the fourth transistor and supplying a second potential;
a first output pad arranged between the first transistor and the third transistor; and
a second output pad arranged between the second transistor and the fourth transistor, wherein a direction in which an axis connecting the first power supply pad with the second power supply pad extends is substantially perpendicular to a direction in which an axis connecting the first output pad with the second output pad extends, wherein drain regions of the first and third transistors are electrically connected to the first output pad by a first wiring, wherein drain regions of the second and fourth transistors are electrically connected to the second output pad by a second wiring, wherein source regions of the first and second transistors are electrically connected to the first power supply pad by a third wiring, wherein source regions of the third and fourth transistors are electrically connected to the second power supply pad by a fourth wiring, wherein each of the first to fourth wirings includes three conductive layers, such that the layers are layered in a direction the direction in which the axis connecting the first power supply pad with the second power supply pad extends and direction in which the axis connecting the first output pad with the second output pad extends, wherein the first wiring includes a lower conductive layer comprising substantially the same shape as that of the drain regions of the first and third transistors, an intermediate conductive layer overlaps at least in a region in which the drain regions of the first and third transistors and the first output pad are formed, and an upper conductive layer overlaps in a region which the first output pad is formed, and wherein the second wiring includes a lower conductive layer comprising substantially the same shape as that of the drain regions of the second and fourth transistors, an intermediate conductive layer overlaps at least in a region in which the drain regions of the second and fourth transistors and the second output pad are formed, and an upper conductive layer overlaps in a region which the second output pad is formed.

6. The semiconductor device according to claim 1,
wherein the third wiring includes an intermediate conductive layer comprising substantially the same shape as that of the source regions of the first and second transistors, and an upper conductive layer overlapping in the region in which the first and second transistors and the first power supply pad are formed, and
wherein the fourth wiring includes a lower conductive layer and an intermediate conductive layer each comprising substantially the same shape as that of the source regions of the third and fourth transistors, and an upper conductive layer overlapping in the region in which the third and fourth transistors and the second power supply pad are formed.

7. The semiconductor device according to claim 1, wherein the semiconductor device is formed in one semiconductor chip, and the first and second transistors are arranged between a chip end and the third and fourth transistors.

8. The semiconductor device according to claim 7, wherein the semiconductor chip further includes an internal circuit, and
wherein the third and fourth transistors are arranged between the internal circuit and the first and second transistors.

9. The semiconductor device according to claim 8, wherein:
- drain regions of the fifth and seventh transistors are electrically connected to the third output pad by a fifth wiring;
- drain regions of the sixth and eighth transistors are electrically connected to the fourth output pad by a sixth wiring;
- each of the fifth and sixth wirings includes three conductive layers;
- the fifth wiring overlaps at least in a region in which the drain regions of the fifth and seventh transistors and the third output pad are formed in a plan view;
- the sixth wiring overlaps at least in a region in which the drain regions of the sixth and eighth transistors and the fourth output pad are formed in a plan view;
- the third wiring further overlaps in a region in which the fifth and sixth transistors are formed in a plan view; and
- the fourth wiring further overlaps in a region in which the seventh and eighth transistors are formed in a plan view.

10. The semiconductor device according to claim 9, wherein the fifth wiring includes a lower conductive layer comprising substantially the same shape as that of the drain regions of the fifth and seventh transistors, an intermediate conductive layer overlaps at least in a region in which the drain regions of the fifth and seventh transistors and the third output pad are formed, and an upper conductive layer overlaps in a region which the third output pad is formed, and
- wherein the sixth wiring includes a lower conductive layer having substantially the same shape as that of the drain regions of the sixth and eighth transistors, an intermediate conductive layer overlaps at least in a region in which the drain regions of the sixth and eighth transistors and the fourth output pad are formed, and an upper conductive layer overlaps in a region which the fourth output pad is formed.

11. The semiconductor device according to claim 9, wherein each of the lower conductive layer and the intermediate conductive layer of the third wiring layer comprise substantially the same shape as that of the source regions of the first, second, fifth and sixth transistors, the upper conductive layer of the third wiring layer overlaps in the region in which the first, second, fifth and sixth transistors and the first power supply pad are formed, and
- wherein each of the lower conductive layer and the intermediate conductive layer of the fourth wiring layer comprise substantially the same shape as that of the source regions of the third, fourth, seventh and eighth transistors, the upper conductive layer of the fourth wiring layer overlaps in the region in which the third, fourth, seventh and eighth transistors and the second power supply pad are formed.

12. The semiconductor device according to claim 1, wherein the first, second, third, and fourth transistors form an H bridge circuit.

13. The semiconductor device according to claim 1, further comprising:
- first conductive type fifth and sixth transistors;
- second conductive type seventh and eighth transistors;
- a third output pad; and
- a fourth output pad,
- wherein the first and second transistors are arranged between the fifth transistor and the sixth transistor,
- wherein the third and fourth transistors are arranged between the seventh transistor and the eighth transistor,
- wherein the third output pad is arranged between the fifth transistor and the seventh transistor, and
- wherein the fourth output pad is arranged between the sixth transistor and the eighth transistor.

14. The semiconductor device according to claim 1, wherein the axis connecting the first output pad and the second output pad extends in a direction parallel with a chip end.

15. A semiconductor device, comprising:
- a first conductive type first transistor;
- a first conductive type second transistor;
- a first power supply pad arranged between the first transistor and the second transistor and supplying a first potential;
- a second conductive type third transistor;
- a second conductive type fourth transistor;
- a second power supply pad arranged between the third transistor and the fourth transistor and supplying a second potential;
- a first output pad arranged between the first transistor and the third transistor; and
- a second output pad arranged between the second transistor and the fourth transistor,
- wherein a direction in which an axis connecting the first power supply pad with the second power supply pad extends is substantially perpendicular to a direction in which an axis connecting the first output pad with the second output pad extends,
- wherein drain regions of the first and third transistors are electrically connected to the first output pad by a wiring, and
- wherein the wiring includes a lower conductive layer comprising a shape substantially the same as a shape of the drain regions of the first and third transistors.

* * * * *